(12) United States Patent
Watanabe

(10) Patent No.: US 6,430,709 B1
(45) Date of Patent: Aug. 6, 2002

(54) APPARATUS AND METHOD FOR DIAGNOSING MICROCOMPUTER MEMORY

(75) Inventor: Satoru Watanabe, Atsugi (JP)

(73) Assignee: Unisia Jecs Corporation, Kanagawa-Ken (JP)

( * ) Notice: Subject to any disclaimer, the term of this patent is extended or adjusted under 35 U.S.C. 154(b) by 0 days.

(21) Appl. No.: 09/382,582

(22) Filed: Aug. 25, 1999

(30) Foreign Application Priority Data

Aug. 25, 1998 (JP) .............................. 10-238522

(51) Int. Cl.⁷ ................................ G06F 11/26

(52) U.S. Cl. ......................... 714/42; 714/718

(58) Field of Search ............................ 714/42, 37, 718, 714/719, 722

(56) References Cited

U.S. PATENT DOCUMENTS 5,937,367 A * 8/1999 Eckardt ...................... 702/117

* cited by examiner

*Primary Examiner*—Scott T Baderman
(74) *Attorney, Agent, or Firm*—McDermott, Will & Emery

(57) ABSTRACT

The invention enables real time diagnosis of a whole memory region without affecting engine control functions. Judgment is made as to whether an engine is in a prestart condition, or a normal operation condition (engine operating). With prestart, memory diagnosis is performed continuously over the whole region by performing diagnosis with time synchronous jobs, with each job diagnosing a number of bytes obtained from previously determined diagnosis unit bytes multiplied by a set number of cycles. With normal operation, memory diagnosis is performed with time synchronous jobs once in a plurality of cycles, by interrupting the memory being in use at predetermined periods to intermittently perform diagnosis on divided part of the memory each time.

10 Claims, 5 Drawing Sheets

APPARATUS AND METHOD FOR DIAGNOSING MICROCOMPUTER MEMORY

BACKGROUND OF THE INVENTION

1. Field of the Invention

The present invention relates to an apparatus and method for diagnosis memory (RAM and ROM) used in microcomputers for controlling electronic control devices for automobile engines and the like.

2. Description of the Related Art

Heretofore, in automobile engine control devices, in addition to self diagnose of the CPU of the control microcomputer, the CPU also diagnoses the memory such as RAM and ROM. To be specific, when power is applied, before the engine starts, the whole memory region is subjected to a read-write check for the RAM, and a sum check or parity check for the ROM.

Furthermore, with control devices such as electronic controlled throttle valves that directly affect engine behavior, it is necessary to detect memory malfunctions that occur while the engine is operating.

However, because memory diagnosis takes time, memory diagnosis while the engine is operating could affect the engine control functions during the diagnosis.

The present invention takes into consideration the above heretofore problem, with the object of providing real time diagnosis of the whole memory region without affecting the control functions.

SUMMARY OF THE INVENTION

Accordingly, with the present invention, there is provided a high speed diagnosis device for performing continuous diagnosis over a whole memory region prior to using the memory or after using the memory, and a low speed diagnosis device which interrupts the memory being in use at predetermined periods to intermittently perform diagnosis on divided part of the memory each time, to construct an apparatus for diagnosing a microcomputer memory.

Thus, before or after the memory is in use (while memory is not in use), memory diagnosis is performed by the high speed diagnosis which performs continuous diagnosis of the whole memory region. On the other hand, when the memory is in use, diagnosis is performed by the low speed diagnosis which interrupts the memory at predetermined periods to intermittently perform diagnosis on divided part of the memory each time. Hence real time diagnosis of the whole memory region is effectively enabled without affecting the control functions.

The high speed diagnosis device may perform diagnosis with time synchronous jobs, with each job diagnosing a number of bytes obtained from previously determined diagnosis unit bytes multiplied by a set number of cycles.

Thus, high speed diagnosis that performs continuous memory diagnosis of the whole region is possible.

The low speed diagnosis device may perform diagnosis with time synchronous jobs once in a plurality of cycles, with each job diagnosing previously determined diagnosis unit bytes.

Thus, low speed diagnosis suitable for RAM whose capacity is comparatively small is possible.

Alternatively, the low speed diagnosis device may perform diagnosis with time synchronous jobs, with each job diagnosing previously determined diagnosis unit bytes.

Thus, low speed diagnosis suitable for ROM whose capacity is comparatively large is possible.

When diagnosing a memory used in an engine control microcomputer, the high speed diagnosis device diagnoses the memory before the engine is started or when the engine is stopped, and the low speed diagnosis device diagnoses the memory while the engine is operating.

Thus, real time diagnosis of the whole memory region is possible without affecting the control functions of the engine while the engine is operating.

Characteristic features of the present invention and the resultant operation and effects will become more apparent from the embodiments described hereunder.

DESCRIPTION OF THE PREFERRED EMBODIMENTS

Figure 1:
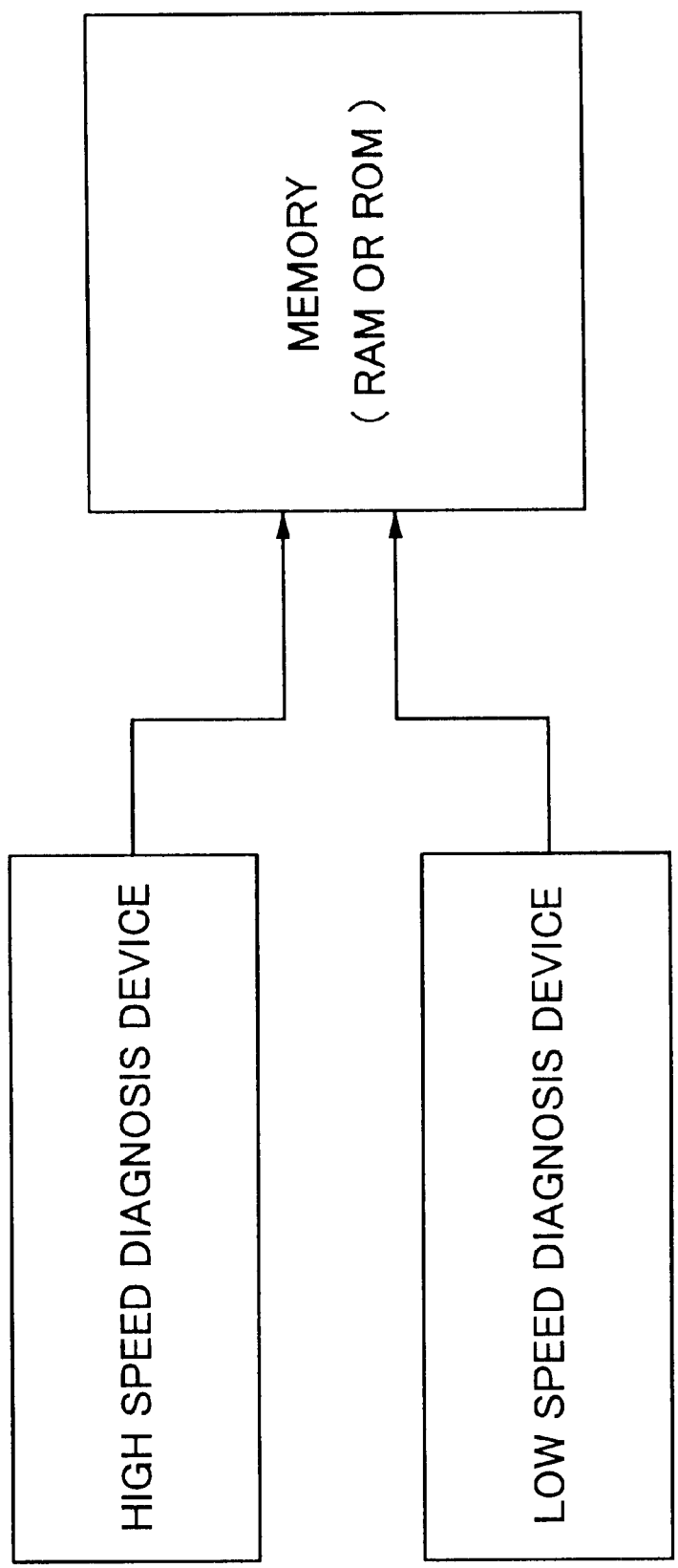
FIG. 1 is a functional block diagram showing the basic construction of the present invention.

The basic construction of an apparatus for diagnosing microcomputer memory according to the present invention is as shown in FIG. 1. Embodiments thereof, specifically embodiments for diagnosing the RAM and ROM of microcomputers used for controlling automobile engines are explained in FIG. 2 through FIG. 5 below.

Figure 2:
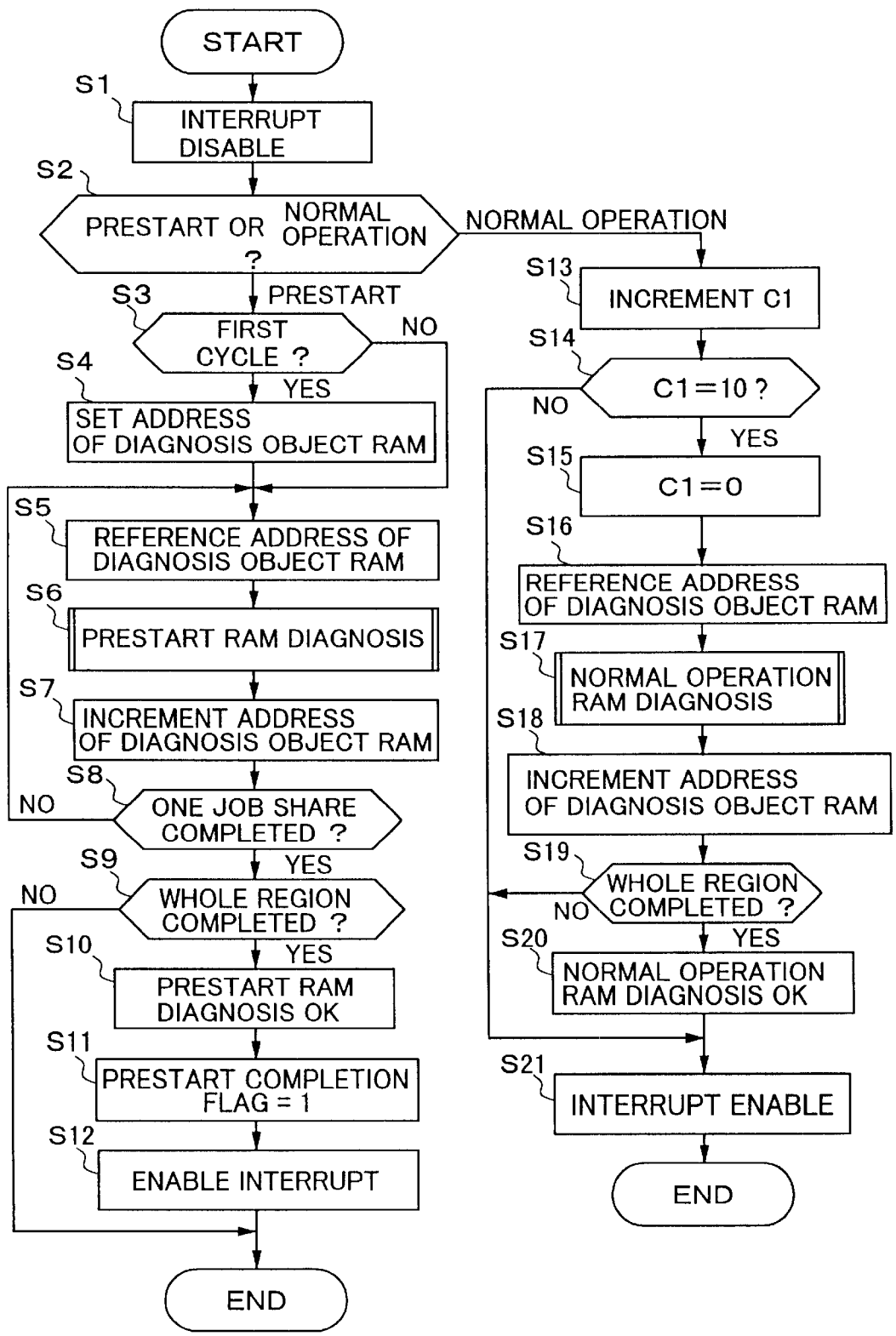
FIG. 2 is a flow chart of a RAM diagnosis illustrating a first embodiment of the present invention.

FIG. 2 is a flow chart of a RAM diagnosis illustrating a first embodiment of the present invention. This diagnosis is performed as a time synchronous (a 10 ms job) by a CPU of the control microcomputer.

In step 1 (abbreviated to S1 in the figures, with other steps similarly abbreviated), in order to avoid overwriting the RAM during diagnosis, interrupting is prohibited.

In step 2, it is judged whether the engine is in the prestart condition (when power is applied) or, conversely, in a normal operation condition (engine operating). To be specific, a prestart completion flag is read, and if this is 0 it is judged to be prestart, while if this is 1 (if set to 1 in step 11 as described later) it is judged to be in normal operation.

If prestart, control proceeds to step 3.

In step 3, it is judged whether this is the first cycle or not. If this is the first cycle, then control proceeds to step 4 where the address of a diagnosis object RAM is set to an initial address. The initial address of the diagnosis object RAM is set such that, by setting a number of diagnosis unit bytes to 4 bytes and diagnosing the diagnosis object RAM by 4 bytes at a time, the whole region of the RAM (with the exception of backup RAM) will eventually be diagnosed.

In step 5, the address of the diagnosis object RAM is referenced.

Figure 3:
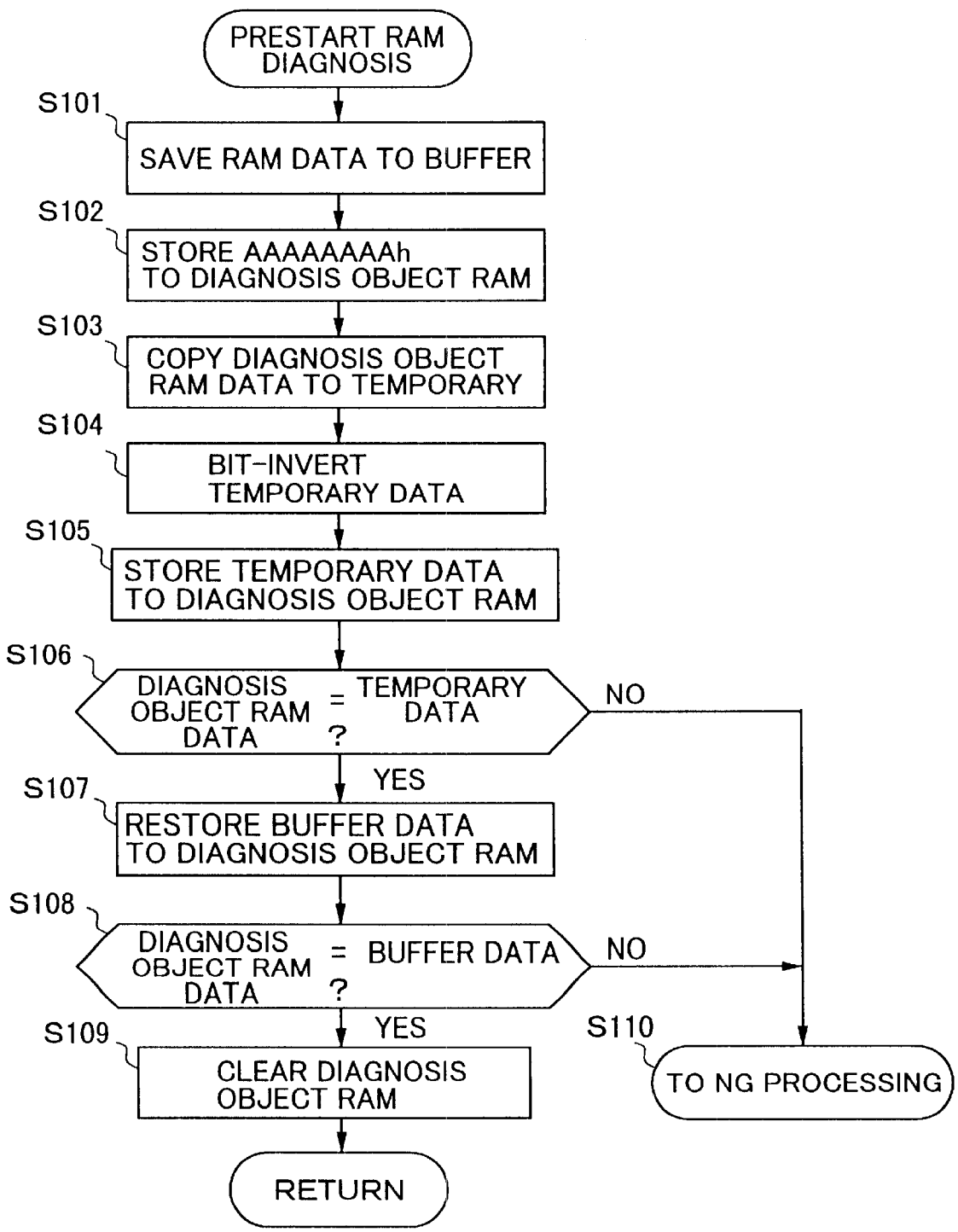
FIG. 3 is a flow chart of a prestart RAM diagnosis in the embodiment.

In step 6, the prestart RAM diagnosis is performed according to the flow in FIG. 3 (step 101~).

In step 101, based on the referenced address of the diagnosis object RAM, data of every 4 bytes of the diagnosis object RAM is saved to a buffer.

In step 102, for example, AAAAAAAAh (4 bytes of data) is stored to the diagnosis object RAM.

In step 103, the data of the diagnosis object RAM is copied to TEMPORARY (a temporary register in the CPU).

In step 104, the data in TEMPORARY is bit-reversed. Thus, in the case of AAAAAAAAh, it becomes 55555555h.

In step 105, the data in TEMPORARY is restored to the diagnosis object RAM.

In step 106, the data in the diagnosis object RAM and the data in TEMPORARY are compared.

Resulting from this comparison, if there is any difference, the RAM diagnosis is judged to be NG, control proceeds to step 110 to initiate NG processing. If there is no difference, control proceeds to step 107.

In step 107, the data in the buffer is restored to the diagnosis object RAM.

In step 108, the data in the diagnosis object RAM and the data in the buffer are compared.

Resulting from this comparison, if there is any difference, the RAM diagnosis is judged to be NG, control proceeds to step 110 to initiate NG processing. If there is no difference, control proceeds to step 109.

In step 109, the diagnosis object RAM is cleared and control returns to the main flow (step 7) in FIG. 2.

In step 7, the address of the diagnosis object RAM is incremented.

In step 8, it is judged whether processing of the previously determined bytes for one job (4 bytes×set number of cycles) is completed or not. If the job is not completed, control returns to step 5. That is to say, step 5 through step 7 is repeated to perform the prestart RAM diagnosis on the next address of the diagnosis object RAM.

When the diagnosis job is completed successfully, control proceeds from step 8 to step 9.

In step 9, it is judged whether diagnosis of the whole region of RAM is completed or not. If not completed, the present job is ended so that the prestart RAM diagnosis can be continued in the next job.

Thus with 10 ms diagnosis jobs, where each job diagnoses a number of bytes obtained from previously determined diagnosis unit bytes multiplied by a set number of cycles, RAM diagnosis is continuously performed for the whole region.

If diagnosis of the whole region of RAM is completed successfully, control proceeds from step 9 to step 10 and the prestart RAM diagnosis is judged to be OK. Furthermore, in step 11 the prestart completion flag is set to 1, and in step 12 interrupting is enabled and the present job is ended.

For normal operation, control proceeds to step 13.

In step 13, C1 is incremented.

In step 14, it is judged whether C1=10 or not.

If C1≠10 (C1<10), interrupting is enabled in step 21 and the present job is ended.

If C1=10, after C1 is reset to 0 in step 15, control proceeds to step 16. That is to say, in periods of every 10 ms×10=100 ms, control proceeds to step 16.

In step 16, the address of the diagnosis object RAM is referenced. Herein, when the prestart RAM diagnosis is ended, the address of the diagnosis object RAM is set to the initial address.

Figure 4:
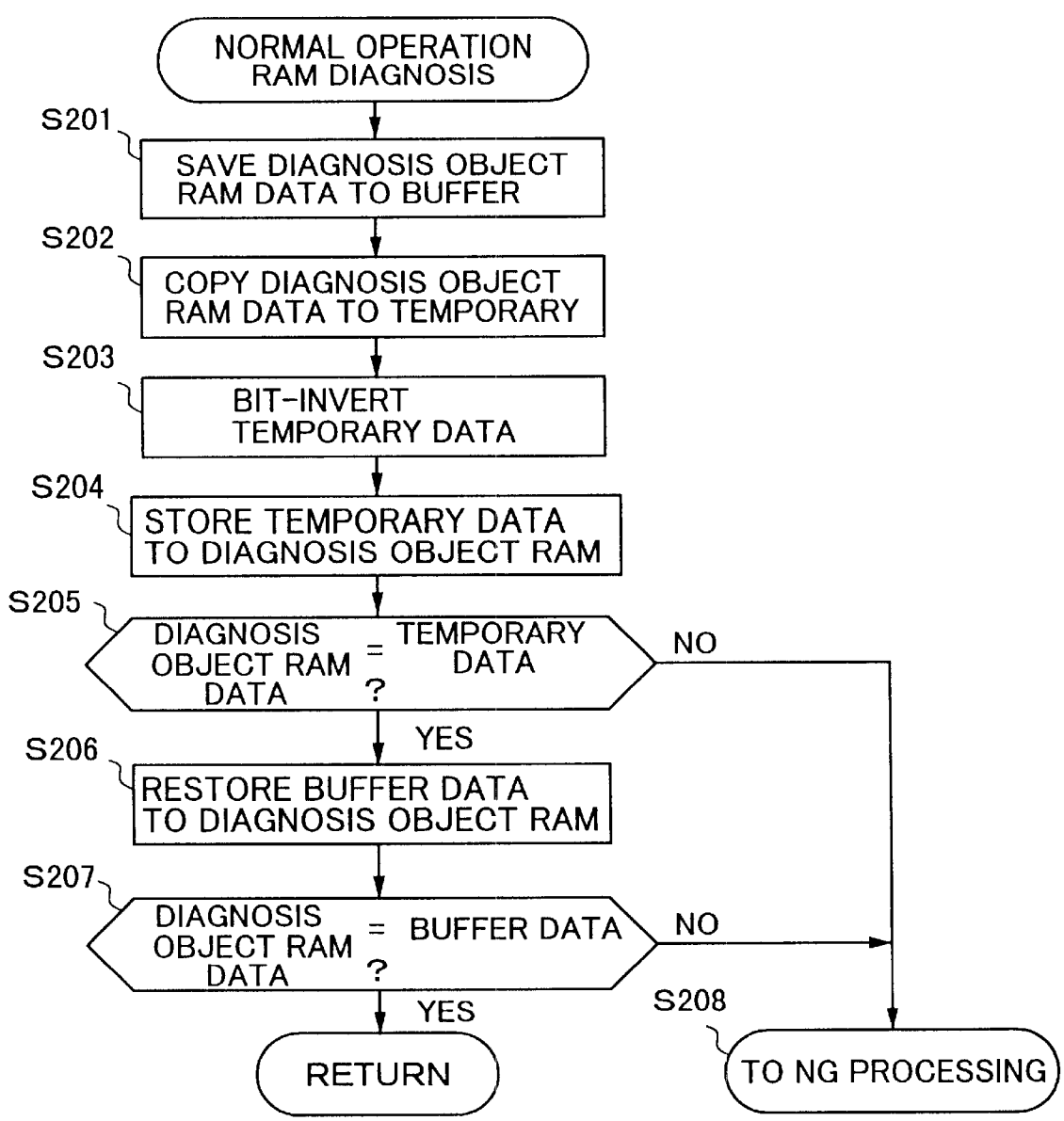
FIG. 4 is a flow chart of a normal operation RAM diagnosis in the embodiment.

In step 17, the normal operation RAM diagnosis is performed according to the flow in FIG. 4 (step 201~)

In step 201, based on the referenced address of the diagnosis object RAM, data of every 4 bytes of the diagnosis object RAM is saved to a buffer.

In step 202, the data of the diagnosis object RAM is copied to TEMPORARY (a temporary register in the CPU).

In step 203, the data in TEMPORARY is bit-reversed.

In step 204, the data in TEMPORARY is stored to the diagnosis object RAM.

In step 205, the data in the diagnosis object RAM and the data in TEMPORARY are compared.

Resulting from this comparison, if there is any difference, the RAM diagnosis is judged to be NG, control proceeds to step 208 to initiate NG processing. If there is no difference, control proceeds to step 206.

In step 206, the data in the buffer is restored to the diagnosis object RAM.

In step 207, the data in the diagnosis object RAM and the data in the buffer are compared.

Resulting from this comparison, if there is any difference, the RAM diagnosis is judged to be NG, control proceeds to step 208 to initiate NG processing. If there is no difference, control returns to the main flow (step 18) in FIG. 2.

In step 18, the address of the diagnosis object RAM is incremented.

In step 19, it is judged whether the diagnosis of the whole region of RAM has been completed or not. If not completed, in step 21 interrupting is enabled and the present job is ended. In this case, following the 10 ms job, computational processing for engine control is performed.

Consequently, for every 10 cycles of the 10 ms job, that is to say, in periods of every 10 ms×10=100 ms, the diagnosis object RAM is diagnosed by 4 bytes at a time. That is to say, with a 10 ms job every one cycle in a plurality of cycles, the RAM being in use is interrupted at predetermined periods, to intermittently perform diagnosis on divided part of the RAM by previously determined diagnosis unit bytes at a time.

If diagnosis of the whole region of RAM is completed successfully, control proceeds from step 19 to step 20 and the normal operation RAM diagnosis is judged to be OK. Furthermore, in step 21 interrupting is enabled and the present job is ended.

Hereafter, as long as the engine is operating, the above-mentioned normal operation RAM diagnosis is performed repeatedly.

Here, steps 1, 2, 3~12 correspond to the high speed diagnosis device, and steps 1, 2, 1 3~21 correspond to the low speed diagnosis device.

If the whole region of RAM is 10K bytes and the diagnosis object RAM is to be diagnosed by 4 bytes at a time, 10K bytes/4 bytes=2560 diagnosis cycles are necessary.

For the prestart RAM diagnosis, in order to diagnose the whole RAM region before starting within 500 ms, if the diagnosis time is set to 400 ms for example, since 2560 cycles/400 ms=64 cycles/10 ms, it is necessary to perform 64 diagnosis cycles in every 10 ms job. Accordingly, in every 10 ms job, 64 cycles×4 bytes=256 bytes of read-write check is performed.

For the normal operation RAM diagnosis, with 10 ms jobs once in every 10 cycles, in periods of every 100 ms, by diagnosing the diagnosis object RAM by 4 bytes at a time, the diagnosis time is (10K bytes/4 bytes)×100 ms=256 sec, that is to say, approximately 4.2 min.

Figure 5:
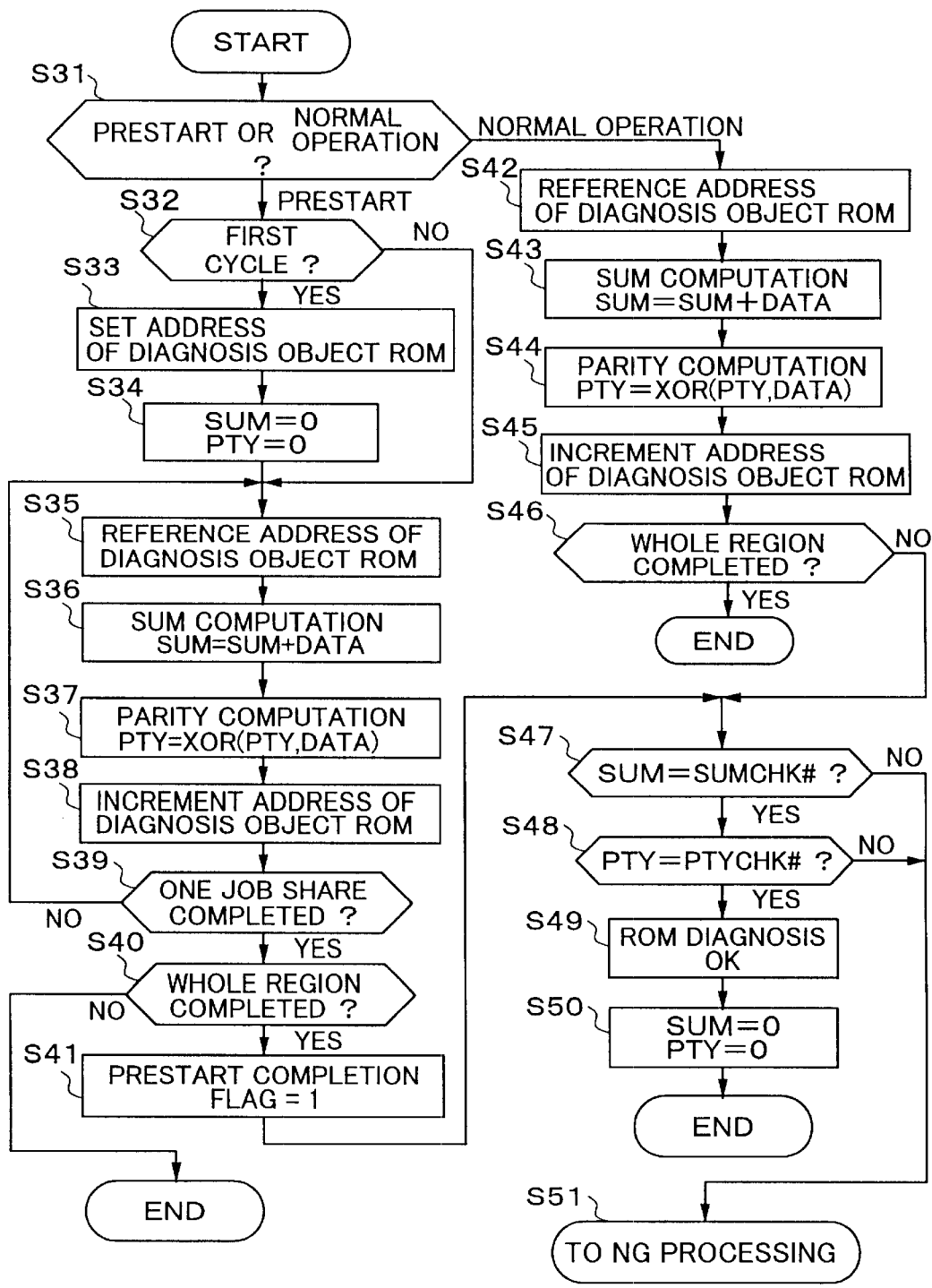
FIG. 5 is a flow chart of a ROM diagnosis illustrating a second embodiment of the present invention.

FIG. 5 is a flow chart of a ROM diagnosis illustrating a second embodiment of the present invention. This diagnosis is performed as a time synchronous job (a 10 ms job) by the CPU of the control microcomputer.

In step 31, it is judged whether the engine is in the prestart condition (when power is applied) or, conversely, in a normal operation condition (engine operating). To be specific, a prestart completion flag is read, and if this is 0 it is judged to be prestart, while if this is 1 (if set to 1 in step 41 as described later) it is judged to be in normal operation.

If prestart, control proceeds to step 32.

In step 32, it is judged whether this is the first cycle or not. If this is the first cycle, then control proceeds to step 33 where the address of the diagnosis object RAM is set to the initial address, and in step 34, a sum value SUM and a parity value PTY re reset to 0. Herein, the initial address of the diagnosis object ROM is set such that, by setting a number of diagnosis unit bytes to 4 bytes and diagnosing the diagnosis object ROM by 4 bytes at a time, the whole region of the ROM will eventually be diagnosed.

In step 35, the address of the diagnosis object ROM is referenced.

In step 36, the data of every 4 bytes of the diagnosis object ROM read from the referenced address of the diagnosis object ROM is added to the sum value SUM, according to the following equation.

SUM=SUM+data

In step 37, the data of every 4 bytes of the diagnosis object ROM data read from the referenced address of the diagnosis object ROM is combined with the parity value PTY, by logical exclusive-or (XOR) according to the following equation.

PTY=XOR (PTY, data)

In step 38 the address of the diagnosis object ROM is incremented.

In step 39, it is judged whether processing of the previously determined bytes for one job (4 bytes×set number of cycles) is completed or not. If the job is not completed, control returns to step 35. That is to say, step 35 through step 38 is repeated to perform the sum computation and the parity computation on the next diagnosis object ROM.

When the sum computation and the parity computation are completed, control proceeds from step 39 to step 40.

In step 40, it is judged whether the sum computation and the parity computation have been completed or not for the whole ROM region. If not completed, the present job is ended so that the sum computation and the parity computation can be continued in the next job.

Thus with 10 ms diagnosis jobs, where each job diagnoses (performs computations for the final diagnosis) a number of bytes obtained from previously determined diagnosis unit bytes multiplied by a set number of cycles, ROM diagnosis is continuously performed for the whole region.

When the sum computations and the parity computations for the whole region of the ROM have been completed, control proceeds from step 40 to step 41 and the prestart completion flag is set to 1, after which control proceeds to step 47 for the final diagnosis for the prestart ROM diagnosis to be performed.

In step 47, the sum value SUM is compared with a previously determined comparative value SUMCHK#. If there is any difference, the ROM diagnosis is judged to be NG, control proceeds to step 51 to initiate NG processing. If there is no difference, control proceeds to step 48.

In step 48, the parity value PTY is compared with a previously determined comparative value PTYCHK#. If there is any difference, the ROM diagnosis is judged to be NG, control proceeds to step 51 to initiate NG processing. If there is no difference, control proceeds to step 49.

In step 49, since both the sum check and the parity check are OK, the ROM diagnosis is judged to be OK, and in the next step 50, the sum value SUM, and the parity value PTY are reset to 0, and the present job is ended.

For normal operation, control proceeds to step 42.

In step 42, the address of the diagnosis object ROM is referenced. Herein, when the prestart ROM diagnosis is ended, the address of the diagnosis object ROM is set to the initial address.

In step 43, the data of every 4 bytes of the diagnosis object ROM read from the referenced address of the diagnosis object ROM is added to the sum value SUM, according to the following equation.

SUM=SUM+data

In step 44, the data of every 4 bytes of the diagnosis object ROM read from the referenced address of the diagnosis object ROM is combined with the parity value PTY, by logical exclusive-or (XOR) according to the following equation.

PTY=XOR (PTY, data)

In step 45, the address of the diagnosis object ROM is incremented.

In step 46, it is judged whether the sum computation and the parity computation have been completed for the whole ROM region. If not completed, the present job is ended. In this case, following the 10 ms job, computational processing for engine control is performed.

Consequently, for every 10 ms job, the sum computation and the parity computation are performed by 4 bytes at a time. That is to say, with 10 ms jobs, the ROM being in use is interrupted at predetermined periods to intermittently perform diagnosis (computation for the final diagnosis) on divided part of the ROM by previously determined diagnosis unit bytes at a time.

When the sum computation and the parity computation for the whole region of the ROM have been completed, control proceeds to step 47 for the final diagnosis for the normal operation ROM diagnosis to be performed.

In step 47, the sum value SUM is compared with the previously determined comparative value SUMCHK#. If there is any difference, the ROM diagnosis is judged to be NG, control proceeds to step 51 to initiate NG processing. If there is no difference, control proceeds to step 48.

In step 48, the parity value PTY is compared with the previously determined comparative value PTYCHK#. If there is any difference, the ROM diagnosis is judged to be NG, control proceeds to step 51 to initiate NG processing. If there is no difference, control proceeds to step 49.

In step 49, since both the sum check and the parity check are OK, the ROM diagnosis is judged to be OK, and in the next step 50 the sum value SUM, and the parity value PTY are reset to 0, and the present job is ended.

Here, steps 31, 32~41, 47~50 correspond to the high speed diagnosis device, and steps 31, 42~46, 47~50 correspond to the low speed diagnosis device.

If the whole region of ROM is 256K bytes and the diagnosis object ROM is to be diagnosed by 4 bytes at a time, 256K bytes/4 bytes=65536 diagnosis cycles are necessary.

For the prestart ROM diagnosis, in order to diagnose the whole ROM region before starting within 500 ms, if the diagnosis time is set to 420 ms for example, since 65536 cycles/420 ms=1560 cycles/10 ms (with a remainder of 16 cycles), it is necessary to perform 1560 diagnosis cycles in every 10 ms job. Accordingly, in every 10 ms job, 1560 cycles×4 bytes=6240 bytes of sum and parity computations are performed.

With the normal operation ROM diagnosis, with 10 ms jobs, by performing sum and parity computations on the diagnosis object ROM by 4 bytes at a time every 10 ms, the diagnosis time is (256K bytes/4 bytes)×10 ms=655 sec, that is to say, approximately 11 min.

Here, regarding the NG processing in step 110 and step 208 of the first embodiment (FIG. 3 and FIG. 4) and in step 51 of the second embodiment (FIG. 5), NG processing is an operation such as turning off the power of the control device.

For example, in engine control devices for automobiles, when electronic controlled throttle valves are controlled, the relay for the power supply circuit for the electronic controlled throttle valve motor is turned OFF. With the relay OFF, although the electronic controlled throttle valves are held in the fail-safe position, relatively samll opening, under the influence of the return spring and the output power of the engine is restricted, it is possible to limp home operation.

Furthermore, with the abovementioned embodiments, although high speed diagnosis is performed before the engine starts, high speed diagnosis may be performed when the engine stops.

As above explained, with the present invention, before and after the memory is in use (while memory is not in use), memory diagnosis is performed by the high speed diagnosis which performs continuous diagnosis of the whole memory region. On the other hand, when the memory is in use, diagnosis is performed by the low speed diagnosis which interrupts the memory at predetermined periods to intermittently perform diagnosis on divided part of the memory each time. Hence real time diagnosis of the whole memory region is effectively enabled without affecting the control functions, thus having widespread industrial applicability.

What we claimed are:

1. An apparatus for diagnosing a microcomputer memory comprising:

high speed diagnosis means for performing continuous diagnosis over a whole memory region prior to using the memory or after using the memory, and low speed diagnosis means which interrupts the memory being in use at predetermined periods to intermittently perform diagnosis on divided part of the memory each time.

2. An apparatus for diagnosing a microcomputer memory according to claim 1, wherein said high speed diagnosis means diagnoses the memory with time synchronous jobs, with each job diagnosing a number of bytes obtained from previously determined diagnosis unit bytes multiplied by a set number of cycles.

3. An apparatus for diagnosing a microcomputer memory according to claim 1, wherein said low speed diagnosis means diagnoses the memory with time synchronous jobs once in a plurality of cycles, with each job diagnosing previously determined diagnosis unit bytes.

4. An apparatus for diagnosing a microcomputer memory according to claim 1, wherein said low speed diagnosis means diagnoses the memory with time synchronous jobs, with each job diagnosing previously determined diagnosis unit bytes.

5. An apparatus for diagnosing a microcomputer memory according to claim 1, wherein said memory is used in an engine control microcomputer, and said high speed diagnosis means diagnoses the memory before the engine is started or when the engine is stopped, and said low speed diagnosis means diagnoses the memory while the engine is operating.

6. A method of diagnosing a microcomputer memory comprising the steps of:

performing continuous diagnosis over a whole memory region prior to using the memory or after using the memory, and interrupting the memory being in use at predetermined periods to intermittently perform diagnosis on divided part of the memory each time.

7. A method of diagnosing a microcomputer memory according to claim 6, wherein diagnosis prior to using the memory or after using the memory is performed with time synchronous jobs, with each job diagnosing a number of bytes obtained from previously determined diagnosis unit bytes multiplied by a set number of cycles.

8. A method of diagnosing a microcomputer memory according to claim 6, wherein diagnosis during memory use is performed with time synchronous jobs once in a plurality of cycles, with each job diagnosing previously determined diagnosis unit bytes.

9. A method of diagnosing a microcomputer memory according to claim 6, wherein diagnosis during memory use is performed with time synchronous jobs, with each job diagnosing previously determined diagnosis unit bytes.

10. A method of diagnosing a microcomputer memory according to claim 6, wherein said memory is used in an engine control microcomputer, and diagnosis prior to using the memory or after using the memory is performed before the engine is started or when the engine is stopped, and diagnosis during memory use is performed while the engine is operating.

* * * * *